(12) United States Patent
Schoenmakers et al.

(10) Patent No.: US 11,417,497 B2
(45) Date of Patent: Aug. 16, 2022

(54) METHOD OF EXAMINING A SAMPLE USING A CHARGED PARTICLE MICROSCOPE, WHEREIN AN ELECTRON ENERGY-LOSS SPECTROSCOPY (EELS) SPECTRUM IS ACQUIRED

(71) Applicant: FEI Company, Hillsboro, OR (US)

(72) Inventors: Remco Schoenmakers, Eindhoven (NL); Jaydeep Sanjay Belapure, Eindhoven (NL)

(73) Assignee: FEI Company, Hillsboro, OR (US)

( * ) Notice: Subject to any disclaimer, the term of this patent is extended or adjusted under 35 U.S.C. 154(b) by 66 days.

(21) Appl. No.: 16/901,900

(22) Filed: Jun. 15, 2020

(65) Prior Publication Data

US 2020/0395192 A1     Dec. 17, 2020

(30) Foreign Application Priority Data

Jun. 14, 2019   (EP) .................................... 19180167

(51) Int. Cl.
| | |
|---|---|
| *H01J 37/256* | (2006.01) |
| *G01N 23/20091* | (2018.01) |
| *H01J 37/22* | (2006.01) |
| *H01J 37/244* | (2006.01) |
| *H01J 37/28* | (2006.01) |

(52) U.S. Cl.
CPC ...... *H01J 37/222* (2013.01); *G01N 23/20091* (2013.01); *H01J 37/244* (2013.01); *H01J 37/256* (2013.01); *H01J 37/28* (2013.01); *H01J 2237/2007* (2013.01); *H01J 2237/225* (2013.01); *H01J 2237/24485* (2013.01); *H01J 2237/2802* (2013.01); *H01J 2237/2804* (2013.01)

(58) Field of Classification Search
CPC .......... H01J 37/222; H01J 2237/24485; G01N 23/20091
See application file for complete search history.

(56) References Cited

U.S. PATENT DOCUMENTS

| | | | |
|---|---|---|---|
| 2013/0015351 A1 | 1/2013 | Kooijman et al. | |
| 2014/0035943 A1 | 2/2014 | Statham | |
| 2014/0070095 A1* | 3/2014 | Schoenmakers | H01J 37/28 250/305 |
| 2017/0207059 A1* | 7/2017 | Trevor | H01J 37/244 |

(Continued)

OTHER PUBLICATIONS

Scott et al., 'Near-simultaneous dual energy range EELS spectrum imaging' May 2008, Ultramicroscopy 108 pp. 1586-1594.*

*Primary Examiner* — Eliza W Osenbaugh-Stewart

(57) ABSTRACT

The invention relates to a method of examining a sample using a charged particle microscope, comprising the steps of providing a charged particle beam, as well as a sample; scanning said charged particle beam over said sample at a plurality of sample positions; and acquiring an EELS spectrum for each of said plurality of sample positions. According to the method, it comprises the further steps of scanning, once more, said charged particle beam over said sample at said plurality of sample positions; acquiring a further EELS spectrum for each of said plurality of sample positions; and combining, for each of said plurality of sample positions, said EELS spectrum with said further EELS spectrum. With this, it is possible to acquire rapid information on the sample being investigated, allowing for faster processing of samples.

20 Claims, 5 Drawing Sheets

(56) References Cited

U.S. PATENT DOCUMENTS

2017/0316916 A1 11/2017 Stevens et al.
2019/0362953 A1* 11/2019 Trevor .................. H01J 49/025
2021/0246041 A1* 8/2021 Nagaoka .................. B01J 37/18

* cited by examiner

METHOD OF EXAMINING A SAMPLE USING A CHARGED PARTICLE MICROSCOPE, WHEREIN AN ELECTRON ENERGY-LOSS SPECTROSCOPY (EELS) SPECTRUM IS ACQUIRED

The invention relates to a method of examining a sample using a charged particle microscope, comprising the steps of providing a charged particle beam, as well as a sample; scanning said charged particle beam over said sample at a plurality of sample positions; and acquiring an Electron Energy-Loss Spectroscopy (EELS) spectrum for each of said plurality of sample positions.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

One way of analyzing a sample is to make use of an Electron Energy-Loss Spectroscopy (EELS) module. In Electron Energy Loss Spectroscopy (EELS) a material is exposed to a beam of electrons with a known, narrow range of kinetic energies. Some of the electrons will undergo inelastic scattering, which means that they lose energy and have their paths slightly and randomly deflected. The amount of energy loss can be measured via an electron spectrometer and interpreted in terms of what caused the energy loss. Inelastic interactions include phonon excitations, inter- and intra-band transitions, plasmon excitations, inner shell ionizations, and Cherenkov radiation. The inner-shell ionizations are particularly useful for detecting the elemental components of a material. For example, one might find that a larger-than-expected number of electrons comes through the material with 285 eV less energy than they had when they entered the material. This is approximately the amount of energy needed to remove an inner-shell electron from a carbon atom, which can be taken as evidence that there is a significant amount of carbon present in the sample. With some care, and looking at a wide range of energy losses, one can determine the types of atoms, and the numbers of atoms of each type, being struck by the beam. The scattering angle (that is, the amount that the electron's path is deflected) can also be measured, giving information about the dispersion relation of whatever material excitation caused the inelastic scattering.

In EELS a specific position of the sample is irradiated by the beam, and spectral information of detected emissions at that point are collected to form an EELS spectrum of that specific sample point. An EELS spectrum may contain valuable information such as chemical composition, phases or electronic material properties of the sample point being studied. During EELS, the charged particle beam is moved to a first sample point for acquiring an EELS spectrum of that first sample point. A certain dwell time is used in order to obtain good statistics in the EELS spectrum of said first position. Then the beam is moved to the next sample point for acquiring an EELS spectrum of that next sample point. The acquired EELS spectra for a plurality of sample points may be combined in so-called spectral cubes (or Scubes) that contain positional (x, y) and spectral (energy) information. As a post-processing step, data analysis including, for example, extensive multiple linear least square (MLLS) fitting over thousands of spectra is conducted to extract the sought-after information. This is often a very slow and cumbersome process, dependent on the user's skills and desired information to be derived and is usually done offline at a later stage.

With the above in mind, it is an object to provide an improved method of performing EELS in a charged particle microscope. It is in particular an object to obtain EELS spectral data in a more rapid, more accurate and/or improved manner.

To this end, a method of examining a sample using a charged particle microscope is provided, as defined in claim 1. In the method, a sample and a charged particle beam are provided. The charged particle beam is scanned over the sample at a plurality of sample positions. For each of these positions an EELS spectrum is acquired. With this, a Scube (containing positional information and an associated EELS spectrum) is obtained. The Scube allows the extraction of one or more first features of the sample at said plurality of sample positions. According to the method as defined herein, the method comprises the further steps of scanning said charged particle beam over said sample at said plurality of sample positions. Thus, in other words, the same sample positions are scanned for at least one more time. For each of said plurality of sample positions a further EELS spectrum is obtained. Thus, a further Scube (containing positional information and an associated further EELS spectrum) is obtained. The further Scube enables the extraction of one or more second features of the sample at said plurality of sample positions. For each of the plurality of positions this further EELS spectrum is combined with the previously obtained EELS spectrum. The step of combining may include the step of adding obtained EELS spectra, i.e. by simple addition of the further Scube to the Scube. However, the step of combining may include alternative, or further steps as well, such as for example a correction or an averaging, for example. Said step of combining may, in an embodiment, be done by a control unit.

In effect, the method as defined herein allows a full EELS spectrum for selected positions of the sample to be gradually build up by scanning the sample multiple times. Each scan allows information about the sample to be obtained, which can be analyzed and shown to a user, for example. Thus, rather than spending a lot of valuable tool time on a single point, the available tool time is used to scan multiple points, each point with a shorter dwell time. Although this shorter dwell time gives less information per sample point (compared to a longer dwell time for a single sample point), it does allow valuable information to be obtained for the sample and allows the user to be provided with feedback about the sample. This offers quick insight in the sample while the sample is still being investigated with the microscope, i.e. real-time feedback during acquisition of the data, rather than post-acquisition feedback. The information obtained during investigation of the sample may then be used by the user to alter specifics about the acquisition. For example, if after a few quick scans of a relatively large size or region, certain material interfaces are becoming clear, the user may crop the field of view to only those regions, enabling much faster and more informed acquisitions, which is interesting for high throughput applications, such as e.g. in semiconductors metrology and material Science. Hence, the user may continue the acquisition, stop the acquisition, or move the acquisition to another portion of the sample, allowing for a more effective method of performing EELS in a charged particle microscope.

As an additional advantage, the relatively shorter dwell times enable a drift correction to be applied during the acquisition, with which the quality of the method can be improved as well.

With this the object as defined herein is achieved.

Advantageous embodiments will be described below.

In an embodiment, the method comprises the step of providing, by a control unit, an image representation of said sample, wherein said image representation contains at least information on said EELS spectrum, said further EELS spectrum and/or said combined EELS spectrum. In particular, said image representation may contain features extracted from said EELS spectrum, said further EELS spectrum and/or said combined EELS spectrum.

In an embodiment, the method comprises the step of extracting, using said EELS spectrum, one or more first features of said sample. In an embodiment, the method comprises the step of extracting, using said further EELS spectrum, one or more second features of said sample.

In an embodiment, a first Scube is obtained, wherein said first Scube comprises said EELS spectra for said plurality of sample points acquired during a first scan. The method may comprise the step of acquiring a second Scube by acquiring further EELS spectra for said plurality of sample points by performing a second scan. Said first and second Scube may be combined, and analysed for extracting one or more features of said sample. Said extracted features may be shown in an image representation of said sample.

In an embodiment, the method comprises the step of associating, with reference to an HSV color space, a corresponding plurality of different color hues to said first and second features and/or to said extracted features, wherein said image representation contains said different color hues. The HSV color space is a color space that uses hue (often referred to as "color", e.g. red, green, blue), saturation (often referred to as the intensity or pureness of the color) and value (often referred to as lightness or darkness of the color) to describe attributes of a specific color. The HSV color space can be represented in a cylindrical geometry, with hue, its angular dimension, starting at the red primary at 0°, passing through the green primary at 120° and the blue primary at 240°, and then wrapping back to red at 360°. The central vertical axis comprises the neutral, achromatic, or gray colors, ranging from black at value 0, the bottom, to white at value 1, the top. With increasing radius, the saturation of the color increases.

In principle, any color can be described in the HSV color space regardless of the actual color space being used. Thus, the method as described herein is not limited to the use of a specific color space and can be applied in an RGB color space (since all RGB colors can be described with reference to an HSV color space as well) as well, or any other color space for that matter.

By providing an image representation of the sample, wherein said image representation contains hue information that is associated with features that are based on the acquired EELS data, it is possible to provide a user (in particular a human operator) with a real time semi-quantitative structural/chemical mapping tool. The image representation, including hue information, may be updated after every new scan, i.e after the acquisition of a further Scube.

In an embodiment, the method comprises the step of denoising said EELS spectrum and/or said further EELS spectrum. It is conceivable that the method comprises the step of denoising said combined EELS spectrum. This allows for denoising of spectra that are already obtained, and leads to better noise properties of resulting spectra going into post-processing, which may include post-processing for image representation as described above, and/or for data analysis as described below, for example. The method may contain the step of a drift correction as well.

The method as described herein is very useful for obtaining informative EELS spectra for dose sensitive specimens. In an embodiment, therefore, use is made of an electron dose on the sample that does not exceed 20 $e^-/Å^2$, and in particular an electron dose that does not exceed 5 $e^-/Å^2$. With this, damage to the sample can be prevented. These extremely low-dose scanning applications are useful in particular in life science, for thin samples, and/or atomic resolved use cases, for example.

In an embodiment, the method comprises the step of analyzing said EELS spectrum and/or said further EELS spectrum. In particular, the method may comprise the step of using Multi-Variate analysis, and in particular using Multi-Variate analysis on one or more of the obtained Scubes. The Multi-Variate Analysis (MVA) techniques can be applied to a Scube (or a combination of one or more Scubes) to look for potential features in it, without analysis or modelling any individual spectrum at all. Hence, the MVA technique is relatively fast. The use of MVA enables real time feature extraction even in noisy data. This enables a real-time EELS-derived tool for visualizing qualitative features—structural, phases or chemical maps. In particular in combination with color-coding of features, this provides useful information to the user.

It is noted that the use of the MVA technique is in principle known, but only as a post-processing technique. By using the MVA on the obtained Scubes it becomes possible to rapidly analyse the incoming data, which allows real time data analysis to be performed.

Additionally, the use of MVA in combination with low dose applications as defined above provides a way of obtaining relevant data on dose sensitive specimens.

The method as defined herein may, in an embodiment, integrate the concepts of unsupervised Multi-Variate analysis techniques, such as principal component analysis (PCA), independent component analysis (ICA), nonnegative matrix factorization (NMF) and/or clustering (e.g. k-mean), together to treat the Scube (or Scubes) as a whole (without the need of background subtracting and modelling every individual spectrum) and extract the spectral features. This results in a quick and accurate qualitative representation which is connected to characteristic properties such as structures, phases, or compositions. Although these features may not be the actual individual atomic elemental representations, they serve to be quite inferential to aid an expert user in real time navigating or assessing the region of interest.

According to an aspect, a charged particle microscope for examining a sample using the method as disclosed herein is provided. The charged particle microscope comprises: an optics column, including a charged particle source, a final probe forming lens and a scanner, for focusing a beam of charged particles emitted from said charged particle source onto a sample; a sample stage positioned downstream of said final probe forming lens and arranged for holding said sample; a first detector for detecting emissions of a first type originating from said sample in response to the incidence of charged particles emitted from said charged particle source; and a control unit and a processing device connected to said first detector; wherein said charged particle microscope is arranged for executing the method as disclosed herein.

The microscope as disclosed herein is arranged for performing multiple scans on the specimen and acquiring EELS spectral data cubes in each scan.

The control unit and/or the processing device are arranged for extracting features from the acquired Scubes. In an embodiment, this may include pre-processing of the acquired Scubes, and transformation of the Scubes into a standardized restructured matrix. The features can be extracted from this standardized restructured matrix by using a Multivariate analysis technique, which can be performed by the control unit and/or the processing device. The results, which may include color-coded information in an image representation, can be shown on a screen device.

The method and device described above may, in an embodiment, generally comprise three main steps and/or units, which can be defined by means of blocks a-c below:

a) Acquisition of EELS Scubes in multiple scans;
b) Processing of the acquired Scubes and feature extraction;
c) Visualization (in real time) of the obtained features.

Block (a) controls the EELS detector and the scanning module, as well as possible image alignment techniques (drift correction). The acquired multiple short-scans continuously feed new Scubes to refine the EELS representations.

Block (b) is a Scube pre-processing module. It removes any unwanted spiky events from the Scube which might distort the results. The Scube is flattened as a matrix, each row containing a spectrum. The Scube is mean centered (each column), resulting in a restructured matrix.

Block (b) may also transforms the higher dimensional restructured matrix into a lower dimensional space represented by the principal components. On to this data, further MVA techniques (such as ICA/Component rotation) are implemented to rotate the principal components to optimally extract the features.

Block (d) combines the acquired features in a specific way. They are back-transformed as images and visualized in order to obtain the colorEELS representation. Next to that, each spectrum can be reconstructed from the lower dimensional representation and will then show improved spectral quality which can be further utilized for detailed quantification in the traditional way.

The method and device as disclosed herein will now be elucidated in more detail on the basis of exemplary embodiments and the accompanying schematic drawings, in which.

Figure 4:
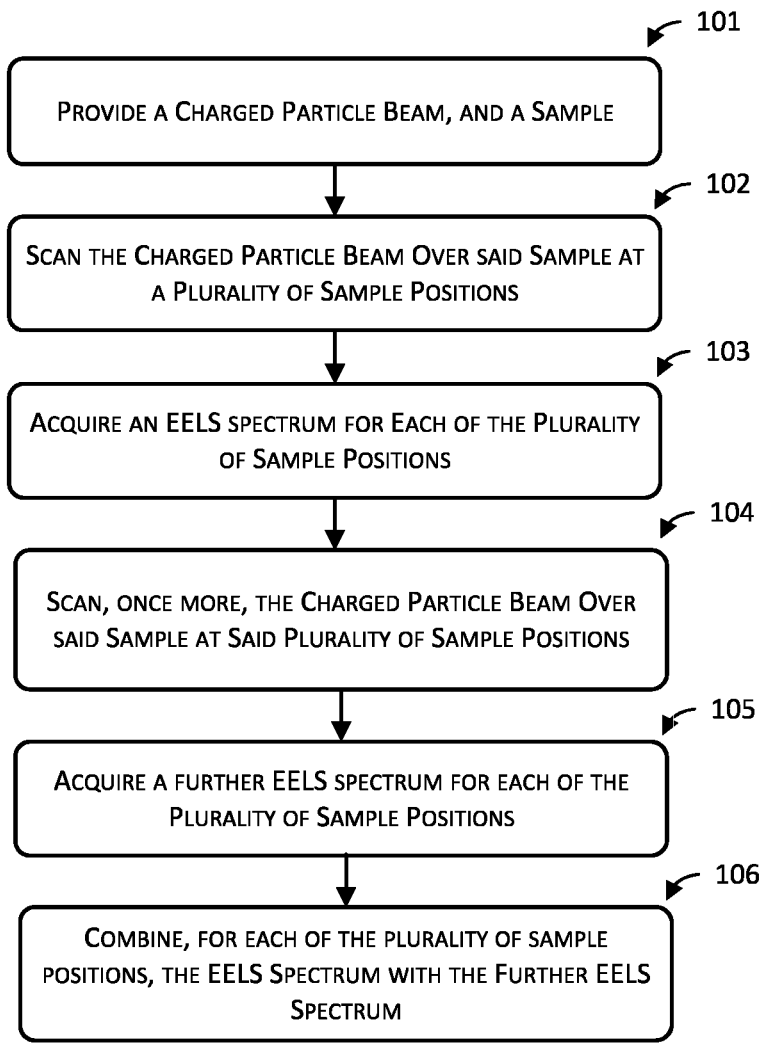

FIG. 4 schematically shows an embodiment of the method as disclosed herein; and

Figure 5A:
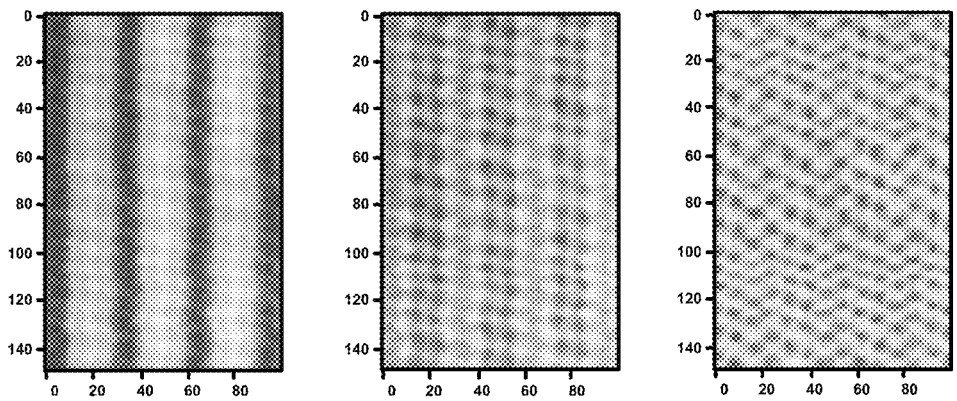
Figure 5B:
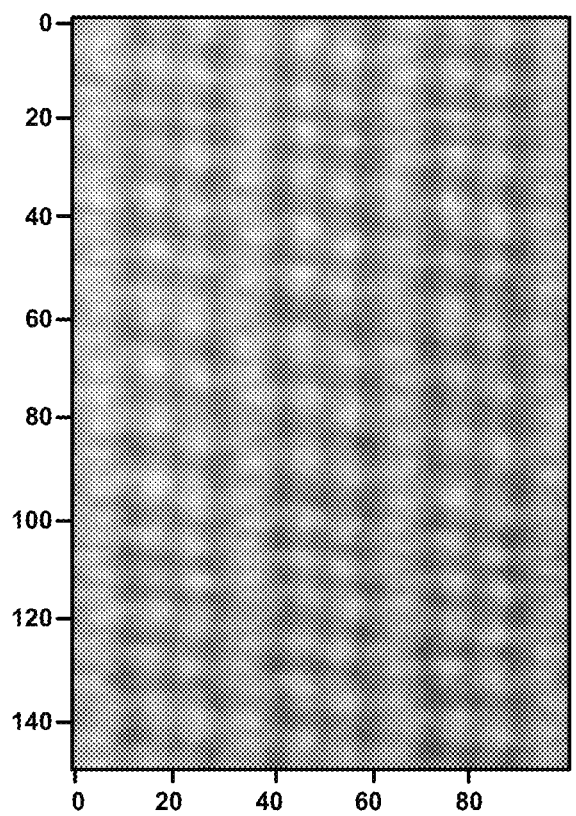

FIGS. 5A and 5B show examples of images obtainable with the method as described herein.

In the Figures, where pertinent, corresponding parts are indicated using corresponding reference symbols. It should be noted that, in general, the Figures are not to scale.

Figure 1:
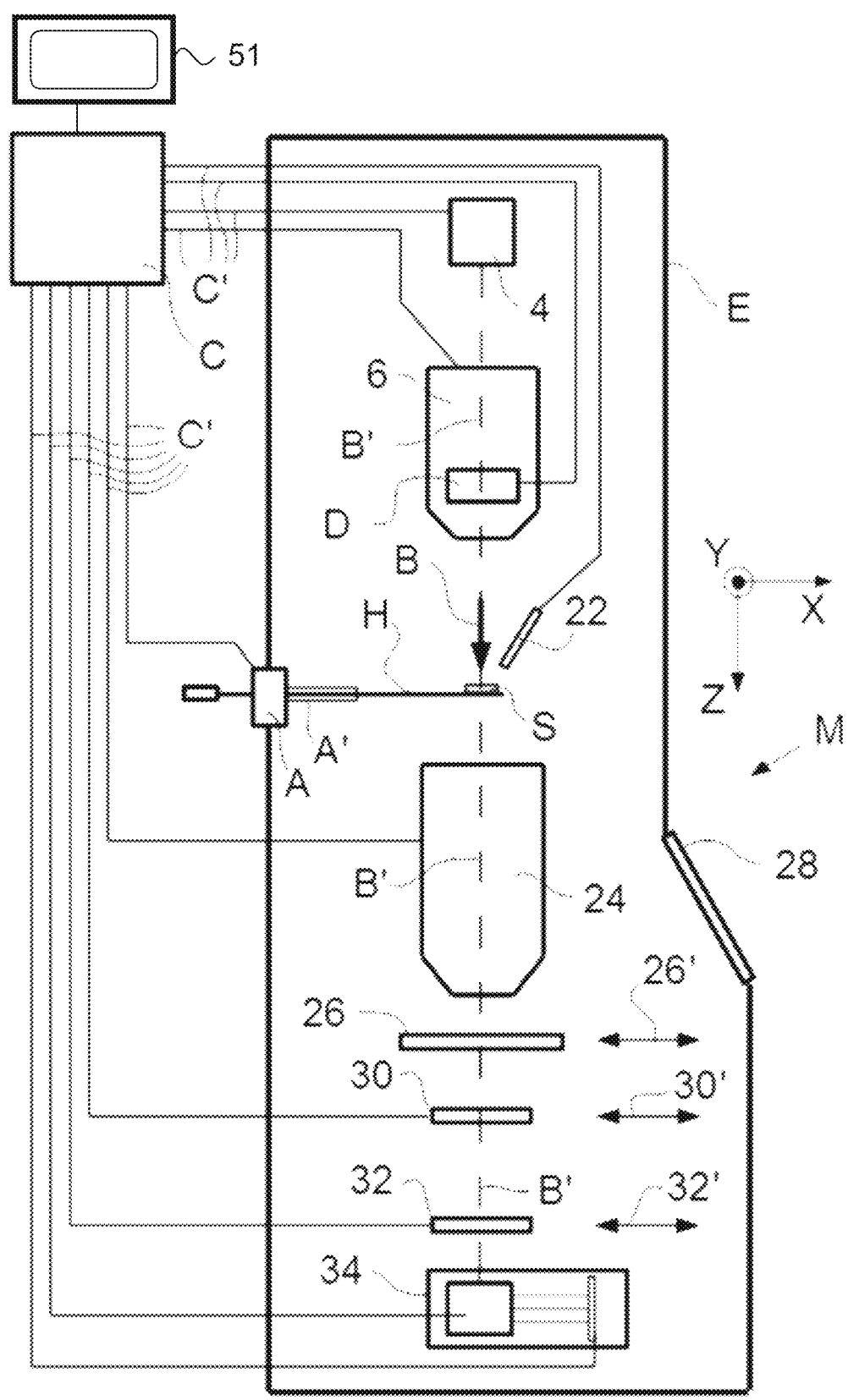
FIG. 1 shows a longitudinal cross-sectional view of a charged-particle microscope.

FIG. 1 is a highly schematic depiction of an embodiment of a transmission charged particle microscope M, which, in this case, is a TEM/STEM (though, in the context of the present disclosure, it could just as validly be an ion-based or proton microscope, for example). In the Figure, within a vacuum enclosure E, an electron source 4 (such as a Schottky emitter, for example) produces a beam (B) of electrons that traverse an electron-optical illuminator 6, serving to direct/focus them onto a chosen part of a sample S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The sample S is held on a sample holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the sample S to be irradiated/imaged/inspected by the electron beam traveling along axis B' (and/or allows scanning motion to be performed as an alternative to beam scanning [using deflector(s) D], and/or allows selected parts of the sample S to be machined by a (non-depicted) focused ion beam, for example).

The (focused) electron beam B traveling along axis B' will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') so as to get it out of the way of axis B'.

STEM recorder 32. An output from recorder 32 can be recorded as a function of (X,Y) scanning position of the beam B on the sample S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (which may be a combined controller and processor) C is connected to various illustrated components via control lines (buses) C'. Controller can be connected to a computer screen 51, which may be provided with a user interface (UI). This controller C can provide a variety of functions, such as synchronizing actions, providing setpoints, processing signals, performing calculations, and displaying messages/information on a display device (not depicted). It will be understood that the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, recorder 32, spectroscopic apparatus 34, etc.

Figure 2:
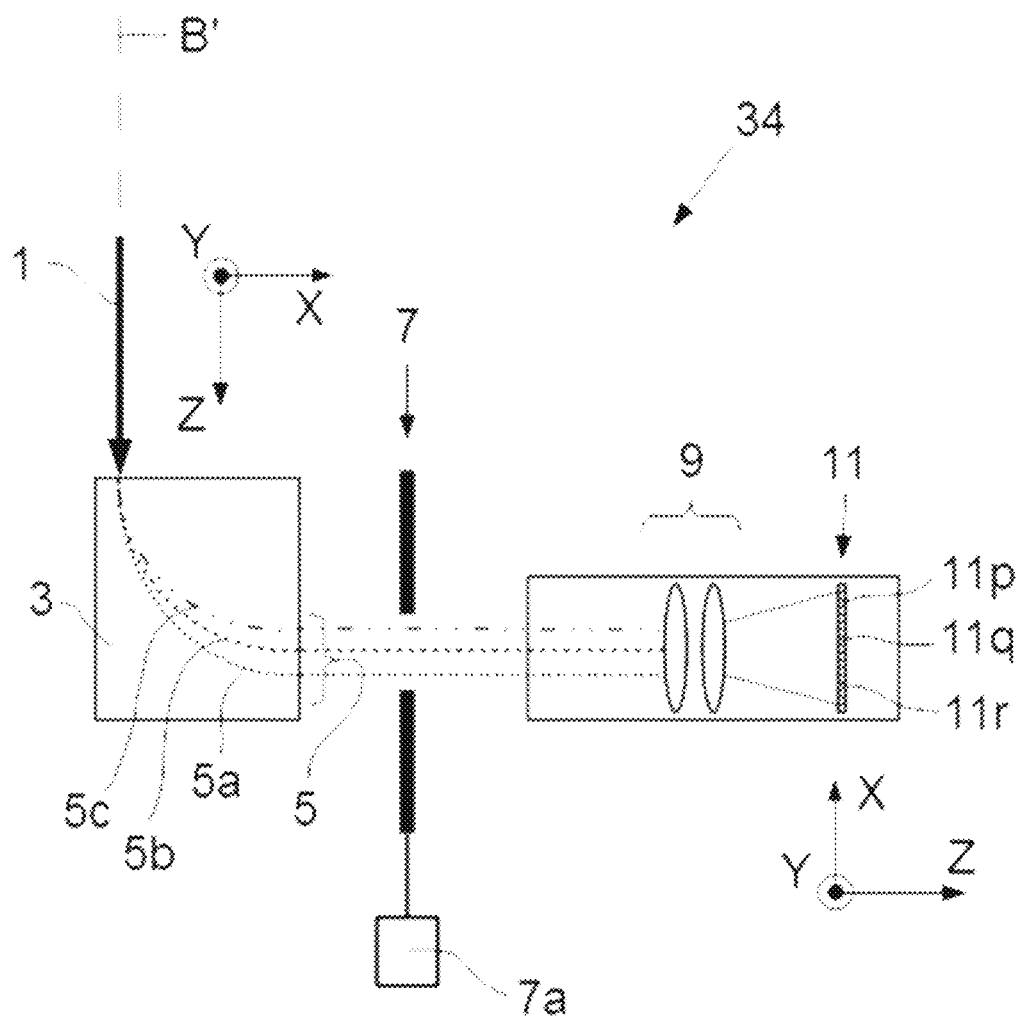
FIG. 2 shows an enlarged longitudinal cross-sectional view of a spectroscopic apparatus.

Turning now to FIG. 2, this shows an enlarged and more detailed view of an embodiment of the spectroscopic apparatus 34 in FIG. 1. In the Figure, a flux 1 of electrons (which has passed through sample S and imaging system 24) is shown propagating along electron-optical axis B'. This flux 1 enters a dispersing device 3 ("electron prism"), where it is dispersed (fanned out) into an energy-resolved (energy-differentiated) array 5 of spectral sub-beams (schematically indicated in FIG. 2 using broken lines), which are distributed along dispersion direction X; for illustration purposes, three of these sub-beams are labelled 5a, 5b and 5c in the Figure. Note in this regard that, conventionally, propagation is considered to occur along the Z direction, and the depicted Cartesian coordinate system thus "co-deflects with" the flux 1 within the dispersing device 3.

Downstream of the dispersing device 3, the array 5 of sub-beams encounters an adjustable/retractable slit (letter-box) 7, which can, for example, be used in EFTEM-mode to select/admit a given portion of the array 5 and to discard/occlude other portions thereof; to this end, the slit 7 is connected to an actuation device 7a that can be invoked to open/close/move the (opening in the) slit 7 as desired. In EELS mode, this slit 7 is usually (fully) open/retracted. The skilled artisan will understand that the slit 7 is advantageously disposed at a location at or proximal to a dispersion plane of the spectroscopic apparatus 34; similarly, the detector 11 is also advantageously located at or proximal to such a plane. If required, it is possible to aim/shift the array 5 of spectral sub-beams falling upon the slit 7 by appropriately adjusting, for example, (an electrical signal to) the dispersing device 3 and/or a drift tube/deflector (not depicted) provided between the dispersing device 3 and slit 7, for instance.

After having traversed slit 7, the (selected portion of the) array 5 passes through post-dispersion electron optics 9, where it is magnified/focused, for example, and ultimately directed/projected onto detector 11. The detector 11 may comprise an assembly of sub-detectors arranged along dispersion direction X, with different sub-detectors being adjustable so as to have different detection sensitivities. For illustration purposes, three of these sub-detectors are labelled 11p, 11q and 11r in the Figure. Each of these sub-detectors (e.g. 11p, 11q, 11r) may, for example, be: An avalanche photodiode, or a linear array of such avalanche photodiodes extending along Y; A pixel (e.g. a 3T pixel) of a CMOS or CCD sensor, or a linear array of such pixels extending along Y.

The sensitivity of a given sub-detector (e.g. 11p, 11q, 11r) can be matched to suit the intensity of the portion of the array 5 that impinges upon it.

It is noted that other detector configurations for measuring EELS spectra are known to those skilled in the art and are applicable in the method as disclosed herein as well. The method is in principle not limited to the use of a specific detector.

Figure 3:
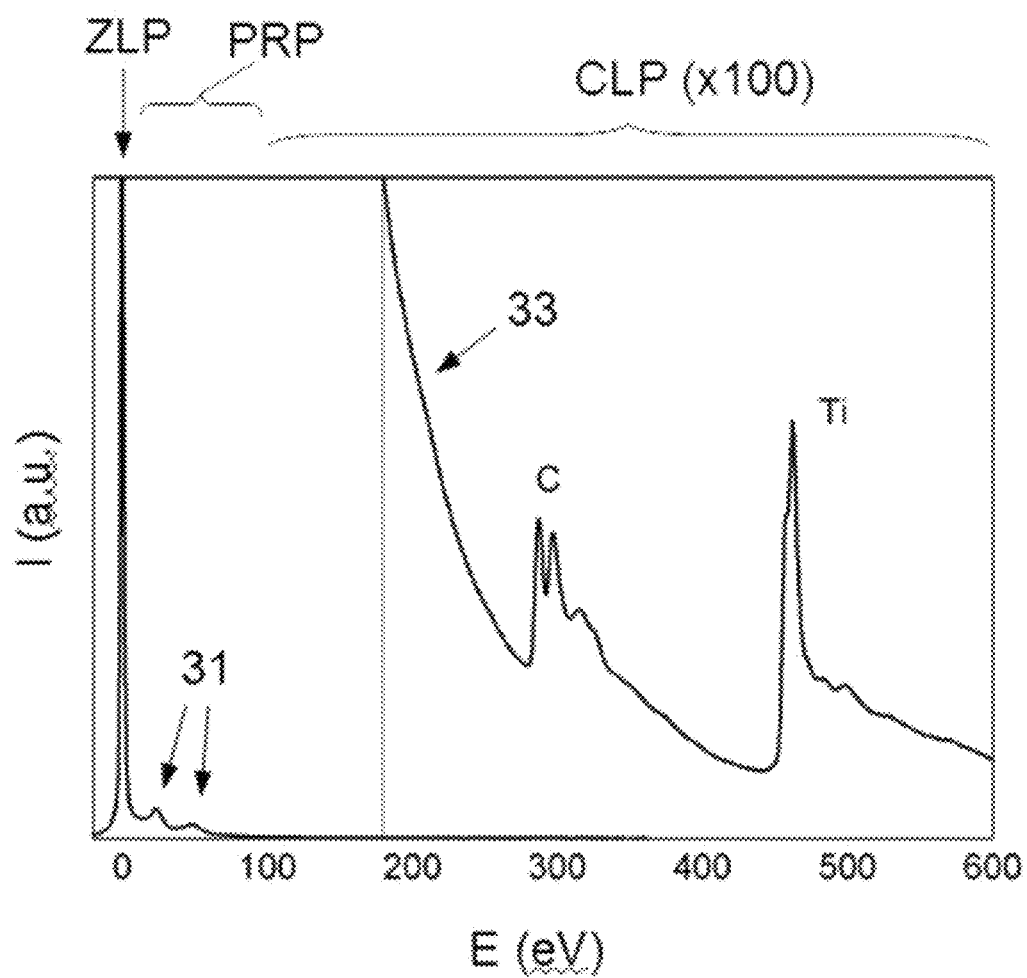
FIG. 3 shows an example of an EELS spectrum.

FIG. 3 shows an example of an EELS spectrum. The Figure renders intensity I (in arbitrary units, a.u.) as a function of energy-loss E (in eV) for electrons that have traversed a sample containing Carbon and Titanium. From left to right, the main features of the spectrum are:

A Zero-Loss Peak ZLP, representing electrons that traverse the sample without undergoing inelastic scattering therein;

A Plasmon Resonance Peak component/section PRP (sometimes referred to as a Valence Loss component), a relatively broad series of peaks/shoulders associated with single or multiple scattering of electrons on plasmons in the specimen. This typically extends from about 0 to 50 eV, although there is no strict definition of its upper limit. It is characterized by peaks/shoulders resulting from outer-shell scattering events in the sample, such as peaks 31. Note that the PRP component usually has a significantly lower intensity than the ZLP.

A Core Loss Peak component/section CLP. This typically starts at about 50 eV (after the PRP component), although there is no strict definition of its lower limit. It is typically of such a low intensity relative to the ZLP/PRP components that, as rendered in FIG. 3, it is enlarged by a multiplication factor (e.g. 100) to improve visibility of its details. As can be seen, it contains (clusters of) peaks/shoulders that can be associated with certain chemical elements (such as C and Ti, in the current example), seated on top of a substantial background contribution 33.

The EELS spectrum shown in FIG. 3 can be measured in ways known to those skilled in the art. In a specific embodiment, use is made of the spectroscopic apparatus 34 of FIG. 2, in which:

Sub-beam 5a comprises (part of) a ZLP spectral component, and impinges upon sub-detector 11r, which is adjusted to have a relatively low detection sensitivity;

Sub-beam 5b comprises (part of) a PRP spectral component, and impinges upon sub-detector 11q, which is adjusted to have an intermediate-value detection sensitivity;

Sub-beam 5c comprises (part of) a CLP spectral component, and impinges upon sub-detector 11p, which is adjusted to have a relatively high detection sensitivity.

Since the acquisition of EELS spectra for the entire sample takes a long time, the method as disclosed herein provides an alternative of performing EELS on a sample. The method is schematically depicted in FIG. 4, and comprises the steps of:

Providing (101) a charged particle beam, as well as a sample;

Scanning (102) said charged particle beam over said sample at a plurality of sample positions;

Acquiring (103) an EELS spectrum for each of said plurality of sample positions;

Scanning (104), once more, said charged particle beam over said sample at said plurality of sample positions;

Acquiring (105) a further EELS spectrum for each of said plurality of sample positions; and Combining (106), for each of said plurality of sample positions, said EELS spectrum with said further EELS spectrum.

The acquired EELS spectra for a plurality of sample points during a single scan may be combined in so-called spectral cubes (or Scubes) that contain positional (x, y) and spectral (energy) information. In a way, steps 103 and 104 as defined above, relating to scanning and acquiring EELS spectra a first time, result in the acquisition of a first Scube. Steps 104 and 105, relating to scanning and acquiring EELS spectra a second time, result in the acquisition of a second Scube. It is noted that the method may comprise the step of acquiring one or more further Scubes, by performing said steps of scanning 104 and acquiring 105 a further EELS spectrum for each of said plurality of sample positions at least one more time. Data analysis may be performed on one or more obtained Scubes, such as on single Scubes or on a combination of Scubes.

In effect, the method allows a relatively sparse EELS spectrum to be obtained for a plurality of sample points, and then acquire a further (relatively sparse) EELS spectrum for the plurality of sample points. Data analysis may be performed on one or more of the EELS spectra obtained during each or every individual scanning. The obtained information may be combined, in particular for acquiring a complete EELS spectrum for the plurality of sample positions. This way, each complete scan allows information about the sample to be obtained, either from the obtained EELS spectra or the performed data analysis thereon. The information can be combined and shown to a user. This allows the user, in particular a human operator, to evaluate the obtained information and to decide on how to continue the data acquisition.

In an embodiment, the method as described herein allows an image representation of said sample to be provided. Said image representation may contain said combined EELS spectrum or at least information thereof.

FIGS. 5a and 5b show an example of an embodiment of such an image representation. The image representation is based on the acquisition of multiple Scubes, wherein each Scube is obtained during a single scan over the sample. The obtained Scubes are transformed and restructured into a standardized matrix, and a multivariate analysis technique (MVA) in the form of principal component analysis is performed on the standardized matrix. A further MVA technique may be performed on the results thereof to extract one or more features of the sample being studied. In the embodiment shown in FIG. 5a, a total of three distinct features are obtained and individually imaged.

The obtained features result in a qualitative representation which is connected to characteristic properties such as structures, phases, or compositions. These features may not be the actual individual atomic elemental representations, but they serve to be quite inferential to aid an expert user in real time navigating or assessing the region of interest. The individual features can be combined, back-transformed as images (as shown in FIG. 5a) and visualized in a single image in order to obtain the final image representation (FIG. 5b). This final image representation can be shown on computer screen 51. Next to that, each spectrum can be reconstructed from the lower dimensional representation and will then show improved spectral quality which can be further utilized for detailed quantification in the traditional way.

It is noted that the final image representation FIG. 5b is shown in black and white, but may contain color coded information. In particular, the individual features may comprise, with reference to an HSV color space (HSV=hue, saturation, value), a specific color hue. As an example, FIG. 5a may contain (from left to right) a red color hue, a green color hue, and a blue color hue. The final image representation shown in FIG. 5b may contain a combination of these color hues, resulting in a purple and blue final image, for example. The image may contain different saturations of a specific hue, and it can be seen that the image contains value information as well. This associating of HSV to the final image, and based on feature information obtained in the data acquisition, allows more relevant information to be shown to the user, and in particular in real time.

The images may be enhanced by the use of one or more image processing techniques. In particular, a denoising technique and/or a drift correction may be applied to the images or to the raw data.

The desired protection is conferred by the appended claims.

The invention claimed is:

1. A method of examining a sample using a charged particle microscope, comprising the steps of:
   providing a charged particle beam, as well as a sample;
   scanning said charged particle beam over said sample at a plurality of sample positions;
   acquiring an EELS spectrum for each of said plurality of sample positions;
   generating an image representation of said sample based on at least a portion of said EELS spectrum acquired for each of said plurality of sample positions;
   scanning said charged particle beam over said sample at said plurality of sample positions;
   acquiring a further EELS spectrum for each of said plurality of sample positions;
   combining, for each of said plurality of sample positions, said EELS spectrum with said further EELS spectrum; and
   updating the image representation of said sample based on at least on the combining of the EELS spectrum with said further EELS spectrum.

2. Method according to claim 1, comprising the step of providing, by a control unit, the image representation of said sample, in particular wherein said image representation contains said combined EELS spectrum.

3. Method according to claim 1, comprising the step of extracting, using said EELS spectrum, one or more first features of said sample.

4. Method according to claim 1, comprising the step of extracting, using said further EELS spectrum, one or more second features of said sample.

5. Method according to claim 2, comprising the step of associating, with reference to an HSV color space, a corresponding plurality of different color hues to said first and second features, wherein said image representation contains said different color hues.

6. Method according to claim 1, comprising the step of denoising said EELS spectrum and/or said further EELS spectrum.

7. Method according to claim 1, comprising the step of denoising said combined EELS spectrum.

8. Method according to claim 1, wherein use is made of an electron dose of <20 $e^-/Å^2$.

9. Method according to claim 1, comprising the step of applying a drift correction to said EELS spectrum and/or said further EELS spectrum.

10. Method according to claim 1, comprising the step of analysing said EELS spectrum and/or said further EELS spectrum, wherein said analyzing comprises the step of using Multi-Variate analysis.

11. The method according to claim 1, further including the steps of:
scanning, said charged particle beam over said sample at said plurality of sample positions one or more additional times;
acquiring, for each iteration of the scanning said plurality of sample positions one or more additional times, an additional EELS spectrum for each of said plurality of sample positions; and
combining, for each of said plurality of sample positions, said EELS spectrum with said further EELS spectrum and said additional EELS spectrum.

12. The method according to claim 11, further comprising the step of updating the image representation of said sample based on the combining of individual additional EELS spectrum acquired for each iteration of the scanning.

13. A charged particle microscope for examining a sample, and comprising:
an optics column, including a charged particle source, a final probe forming lens and a scanner, for focusing a beam of charged particles emitted from said charged particle source onto a sample;
a sample stage positioned downstream of said final probe forming lens and arranged for holding said sample;
a first detector for detecting emissions of a first type originating from said sample in response to the incidence of charged particles emitted from said charged particle source;
a control unit and a processing device connected to said first detector;
wherein said charged particle microscope is arranged for executing a method comprising the steps of:
scanning a charged particle beam over said sample at a plurality of sample positions;
acquiring an EELS spectrum for each of said plurality of sample positions;
generating an image representation of said sample based on at least a portion of said EELS spectrum acquired for each of said plurality of sample positions;
scanning said charged particle beam over said sample at said plurality of sample positions;
acquiring a further EELS spectrum for each of said plurality of sample positions;
combining, for each of said plurality of sample positions, said EELS spectrum with said further EELS spectrum; and
updating the image representation of said sample based on at least on the combining of the EELS spectrum with said further EELS spectrum.

14. The charged particle microscope according to claim 13, wherein the method further comprises the step of providing, by the control unit, the image representation of said sample, in particular wherein said image representation contains said combined EELS spectrum.

15. The charged particle microscope according to claim 13, wherein the method further comprises the step of extracting, using said EELS spectrum, one or more first features of said sample.

16. The charged particle microscope according to claim 13, wherein the method further comprises the step of extracting, using said further EELS spectrum, one or more second features of said sample.

17. The charged particle microscope according to claim 16, wherein the method further comprises the step of associating, with reference to an HSV color space, a corresponding plurality of different color hues to said first and second features, wherein said image representation contains said different color hues.

18. The charged particle microscope according to claim 13, wherein use is made of an electron dose of <20 $e/Å^2$.

19. The charged particle microscope according to claim 13, wherein the method further comprises the step of applying a drift correction to said EELS spectrum and/or said further EELS spectrum.

20. The charged particle microscope according to claim 13, wherein the method further comprises the step of analysing said EELS spectrum and/or said further EELS spectrum, wherein said analyzing comprises the step of using Multi-Variate analysis.

* * * * *